United States Patent
Kelly et al.

(10) Patent No.: US 11,423,577 B2
(45) Date of Patent: Aug. 23, 2022

(54) PRINTED CIRCUIT BOARD ASSEMBLY DEFECT DETECTION

(71) Applicant: International Business Machines Corporation, Armonk, NY (US)

(72) Inventors: Matthew S. Kelly, Oakville (CA); Sebastien Gilbert, Granby (CA); Oswaldo Chacon, Granby (CA)

(73) Assignee: International Business Machines Corporation, Armonk, NY (US)

(*) Notice: Subject to any disclaimer, the term of this patent is extended or adjusted under 35 U.S.C. 154(b) by 274 days.

(21) Appl. No.: 16/923,120

(22) Filed: Jul. 8, 2020

(65) Prior Publication Data
US 2022/0012917 A1    Jan. 13, 2022

(51) Int. Cl.
*G06T 7/00* (2017.01)
*G06T 7/90* (2017.01)
(Continued)

(52) U.S. Cl.
CPC ............ *G06T 7/90* (2017.01); *G01N 21/956* (2013.01); *G06T 7/0004* (2013.01); *G06T 7/11* (2017.01);
(Continued)

(58) Field of Classification Search
CPC . G06T 7/90; G06T 7/0004; G06T 7/11; G06T 2207/10024; G06T 2207/20081; G06T 2207/20084; G06T 2207/30141; G06T 2207/10116; G06T 2207/20076; G06T 2207/30152; G06T 7/0008;
(Continued)

(56) References Cited

U.S. PATENT DOCUMENTS 6,151,380 A * 11/2000 Zweig ............... G01N 23/04
                                                        439/74
6,272,204 B1    8/2001 Amtower
(Continued)

FOREIGN PATENT DOCUMENTS

CN      108596871 A     9/2018
CN      109916906 A     6/2019
(Continued)

OTHER PUBLICATIONS

International Search Report, International Application No. PCT/IB2021/055600, dated Sep. 22, 2021, 8 pgs.
(Continued)

*Primary Examiner* — Aaron W Carter
(74) *Attorney, Agent, or Firm* — Kelli D. Morin (57) ABSTRACT

A method comprises obtaining a plurality of 2-dimensional gray scale images of a portion of a printed circuit board assembly. Each 2-dimensional gray scale image corresponds to one of a plurality of parallel planes intersecting the portion of the printed circuit board assembly at respective different locations. The method further comprises converting the plurality of 2-dimensional gray scale images into a color image. Each of the plurality of 2-dimensional gray scale images corresponds to and is used as input for a respective color channel of the color image. The method further comprises analyzing the color image to detect variation in color that indicates a defect; and outputting an alert indicating the defect in response to detecting the variation in color.

25 Claims, 8 Drawing Sheets

(51) Int. Cl.
  *G06T 7/11* (2017.01)
  *G01N 21/956* (2006.01)
  *H05K 13/08* (2006.01)

(52) U.S. Cl.
  CPC .. *H05K 13/082* (2018.08); *G01N 2021/95638* (2013.01); *G06T 2207/10024* (2013.01); *G06T 2207/20081* (2013.01); *G06T 2207/20084* (2013.01); *G06T 2207/30141* (2013.01)

(58) Field of Classification Search
  CPC ....... G01N 21/956; G01N 2021/95638; G01N 2021/95646; H05K 13/082
  See application file for complete search history.

(56) References Cited

U.S. PATENT DOCUMENTS

| | | | |
|---|---|---|---|
| 6,738,450 B1 | 5/2004 | Barford | |
| 6,847,900 B2 | 1/2005 | Ragland | |
| 6,993,193 B2 | 1/2006 | Smith | |
| 7,202,475 B1* | 4/2007 | Testoni | G01N 23/2252 250/307 |
| 7,903,864 B1* | 3/2011 | Lina | G06T 7/0008 382/141 |
| 8,965,102 B2 | 2/2015 | Tien et al. | |
| 10,048,312 B1* | 8/2018 | Hoffmeyer | G01R 31/2817 |
| 10,054,432 B2 | 8/2018 | Kasahara | |
| 10,134,124 B2 | 11/2018 | Ma et al. | |
| 10,354,414 B2 | 7/2019 | Statham | |
| 2002/0029125 A1* | 3/2002 | Pratt | G01N 21/95607 702/127 |
| 2006/0274883 A1 | 12/2006 | Buck et al. | |
| 2007/0290322 A1 | 12/2007 | Zhao | |
| 2011/0222655 A1 | 9/2011 | Murakami et al. | |
| 2022/0012917 A1* | 1/2022 | Kelly | H05K 13/082 |

FOREIGN PATENT DOCUMENTS

| | | |
|---|---|---|
| CN | 110930347 A | 3/2020 |
| CN | 111145175 A | 5/2020 |
| DE | 102004019536 A1 | 11/2005 |
| WO | 2002039724 A1 | 5/2002 |

OTHER PUBLICATIONS

Anonymous, "Enabling Automated X-Ray Ball Grid Array Non-Wet, In-Line Detection Using a Slanted Carrier Design," IP.com, Disclosure No. IPCOM000146438D, Feb. 13, 2007, 5 pages. <https://priorart.ip.com/IPCOM/000146438>.

Ferguson et al., "Detection and Segmentation of Manufacturing Defects with Convolutional Neural Networks and Transfer Learning," arXiv:1808.02518 [cs.CV], Sep. 3, 2018, 15 pages. <https://arxiv.org/pdf/1808.02518.pdf>.

Hoo-Chang et al., "Deep Convolutional Neural Networks for Computer-Aided Detection: CNN Architectures, Dataset Characteristics and Transfer Learning," IEEE Trans Med Imaging. May 2016 ; 35(5): 1285-1298. doi:10.1109/TMI.2016.2528162, 41 pages. <https://www.ncbi.nlm.nih.gov/pubmed/26886976>.

Jensen et al. "Material and Process Optimization for HIP Defect Elimination," Global SMT & Packaging, vol. 4, No. 2, Mar. 2013, pp. 19-24.

Ko et al. "A Neural Network Approach to the Inspection of Ball Grid Array Solder Joints on Printed Circuit Boards," Proceedings of the IEEE-INNS-ENNS International Joint Conference on Neural Networks. IJCNN 2000. Neural Computing: New Challenges and Perspectives for the New Millennium, Jul. 27, 2000, pp. 233-238. <https://ieeexplore.ieee.org/document/861463>.

Mell et al., "The NIST Definition of Cloud Computing," Recommendations of the National Institute of Standards and Technology, U.S. Department of Commerce, Special Publication 800-145, Sep. 2011, 7 pages.

Scalzo, "Addressing the Challenge of Head-in-Pillow Defects in Electronics Assembly," Indium Corporation, IPC APEX Expo, Apr. 6, 2010, 7 pages. Retrieved from <https://smtnet.com/library/files/upload/challenge-head-in-pillow-defects-ipc.pdf>.

* cited by examiner

PRINTED CIRCUIT BOARD ASSEMBLY DEFECT DETECTION

BACKGROUND

During assembly of a printed circuit board, defects can form, such as head-in-pillow defects, among others. As known to one of skill in the art, a head-in-pillow defect is the incomplete coalescence of a solder joint between a ball-grid-array (BGA), chip-scale package (CSP), or Package-on-package (PoP) and the printed solder paste. Thus, manufactures routinely perform inspections on printed circuit board assemblies (PCBA) to detect and identify defects in the PCBAs. One conventional way of inspecting PCBAs involves the use of automated x-ray inspection equipment (AXI). The AXI typically captures 2-dimensional (2-d) gray scale images of interconnects which can then be analyzed using a simple linear regression model. If a defect is identified using the linear regression model and the 2-d images, then a second, offline inspection is performed using a 3-dimensional (3-d) x-ray image to verify the presence of a defect. During the second, offline inspection the PCBA is rotated to obtain the 3-d x-ray image. However, the second, offline inspection process is relatively slow and can take hours to perform. Additionally, the initial inspection using 2-d x-ray images can have a high false positive rate leading to unnecessary delays to perform the second, offline inspection process. Additionally, the second, offline 3-d inspection process is not well-suited for manufacturing, at least in part due to the length of time needed, and may not identify all defects.

SUMMARY

Aspects of the disclosure may include a method, computer program product, and system. One example of the method comprises obtaining a plurality of 2-dimensional gray scale images of a portion of a printed circuit board assembly. Each 2-dimensional gray scale image corresponds to one of a plurality of parallel planes intersecting the portion of the printed circuit board assembly at respective different locations. The method further comprises converting the plurality of 2-dimensional gray scale images into a color image. Each of the plurality of 2-dimensional gray scale images corresponds to and is used as input for a respective color channel of the color image. The method further comprises analyzing the color image to detect variation in color that indicates a defect; and outputting an alert indicating the defect in response to detecting the variation in color.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described herein provide an improvement in the detection of defects in printed circuit board assemblies (PCBA). In particular, the embodiments described herein can improve both the amount of time required to inspect a PCBA and the accuracy of detecting defects with respect to conventional systems through analysis of a color image generated from 2-d gray scale images, as described in more detail below. Thus, the embodiments described herein are well-suited for use in manufacturing settings and provide an improvement over the current state of PCBA inspection systems and techniques.

Figure 1A:
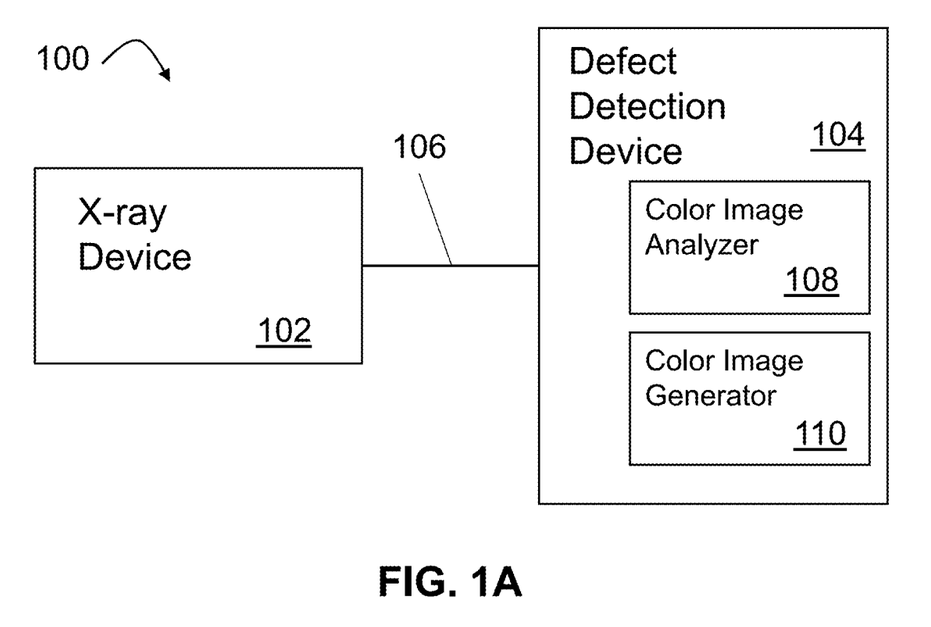
FIGS. 1A-1C are block diagrams depicting illustrative embodiments of an example printed circuit board assembly defect detection system.

FIG. 1A is a high-level block diagram depicting one embodiment of an example system 100 for detecting defects in a PCBA. The system 100 includes an x-ray device 102 and a defect detection device 104 coupled to the x-ray device 102 via a link 106. The link 106 can be implemented using wired, wireless, optical, and/or any other suitable media for a communication channel or link. For example, in some embodiments, the defect detection device 104 is co-located with the x-ray device 102 and coupled to the x-ray device 102 using a cable or wireless link. In other embodiments, the defect detection device 104 is located remote from the x-ray device 102 and coupled to the x-ray device 102 via a network. Thus, in such embodiments, the link 106 includes a network which can be implemented using any number of any suitable physical and/or logical communications topologies. The network can include one or more private or public computing networks. For example, the network may comprise a private network (e.g., a network with a firewall that blocks non-authorized external access) that is associated with the workload. Alternatively, or additionally, the network may comprise a public network, such as the Internet. Thus, the network may form part of a packet-based network, such as a local area network, a wide-area network, and/or a global network such as the Internet. The network can include one or more servers, networks, or databases, and can use one or more communication protocols to transfer data between the x-ray device 102 and the defect detection device 104.

Figure 1B:
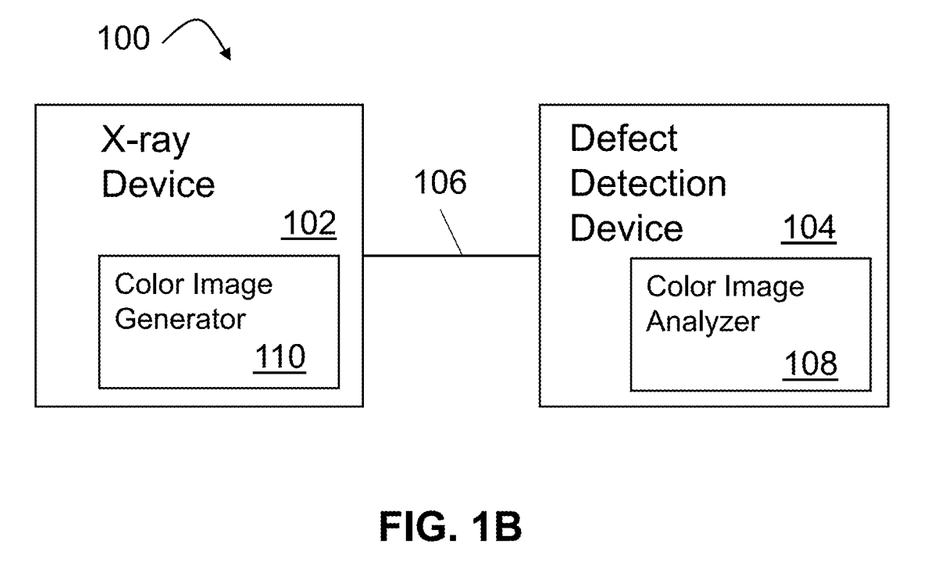
Figure 1C:
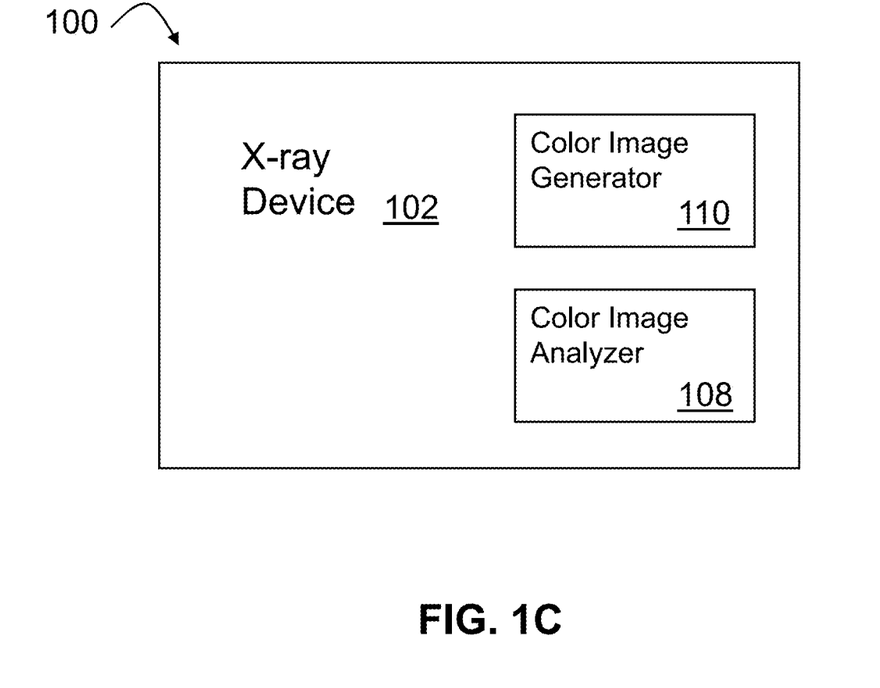

It is to be understood that the embodiment depicted in FIG. 1A is provided by way of example only and that the system 100 can be implemented differently in other embodiments. For example, in FIG. 1A, the defect detection device 104 is configured to implement the color image analyzer 108 and color image generator 110, described in more detail below. However, in other embodiments, such as depicted in FIG. 1B, the x-ray device 102 can be configured to implement the color image generator 110 and the defect detection device 104 implements the color image analyzer 108. Furthermore, in other embodiments, such as depicted in FIG. 1C, the x-ray device 102 is configured to implement both the color image generator 110 and the color image analyzer 108. Thus, in such embodiments, the x-ray device 102 and the defect detection device 104 are implemented as a single device that share a common housing. That is, a single device may perform the functionality of the x-ray device 102 (e.g. capturing x-ray images) and the functionality of the defect detection device 104. However, it is to be understood that although contained within the housing of a single device in such embodiments, separate components can be configured to perform the respective functionality described herein (e.g. capturing x-ray images, generating color images, and analyzing color images).

Figure 2:
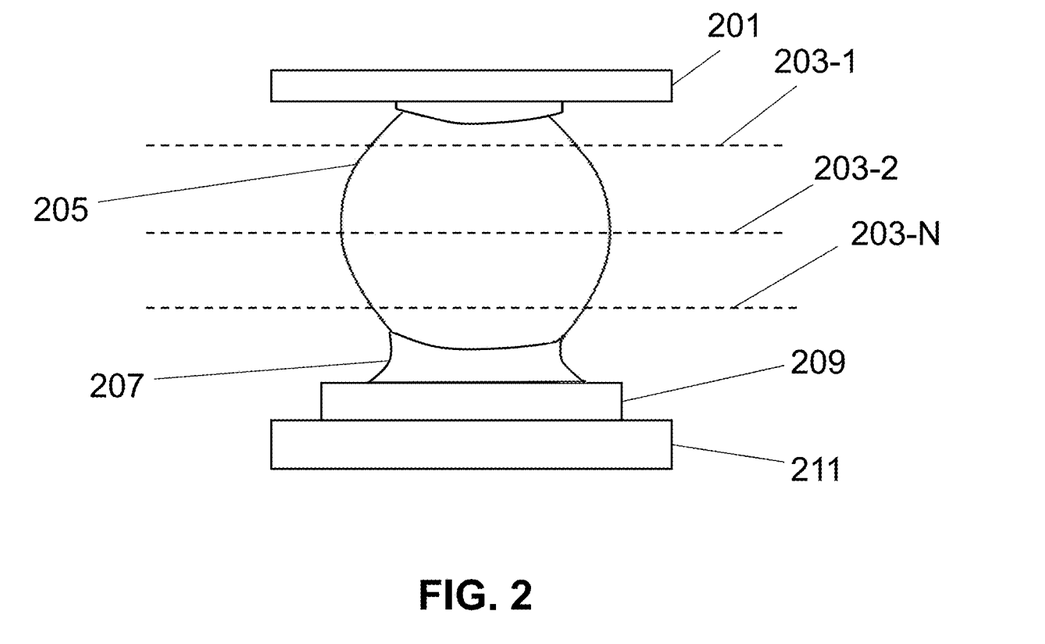
FIG. 2 depicts a side view of an example portion of a printed circuit board assembly.

The x-ray device 102 is configured to capture a plurality of 2-dimensional gray scale images of a portion of the PCBA, similar to the 2-dimensional gray scale images captured by conventional automated x-ray inspection equipment (AXI). Each 2-dimensional gray scale image corresponds to one of a plurality of parallel planes intersecting the portion of the PCBA at respective different locations. Thus, the 2-d gray scale images are also referred to herein as image slices. For example, FIG. 2 depicts a plurality of parallel planes intersecting a cross-section of a portion of a PCBA. In particular, for purposes of illustration, FIG. 2 depicts a single solder interconnect of a ball grid array. However, it is to be understood that each image slice may contain a plurality of such interconnects.

The example of FIG. 2 includes a portion of ball grid array 201, solder ball 205, solder paste 207, pad 209, and printed circuit board 211. The x-ray device 102 is configured to capture a respective 2-d gray scale image at each of planes 203-1, 203-2, and 203-N, where N is the total number of planes. In this example, there are 3 separate parallel planes intersecting the PCBA at which the x-ray device 102 captures images. However, in other embodiments, 2 or more than 3 planes can be used. In this example, the image at plane 203-1 is also referred to as a package slice image, the image at plane 203-2 is also referred to as a mid-ball slice image, and the image at plane 203-N is also referred to as a pad slice image. Examples of a package slice image, mid-ball slice image, and pad slice image are depicted as images 320-1, 320-2, and 320-N, respectively.

In this example, the x-ray device 102 provides the images 320-1, 320-2, and 320-N to the defect detection device 104 via link 106. The defect detection device 104 is configured to implement a color image generator 110 and a color image analyzer 108. The color image generator 110 generates a color image using the images 320-1, 320-2 and 320-N. In particular, the color image generator 110 is configured to use one of each of the images 320-1, 320-2, and 320-N as an input into a respective color channel of a color image 324, shown in FIG. 3. For example, in the embodiment shown in FIG. 3, the image 320-1 is input into the red channel 322-1, the image 320-2 is input into the green channel 322-2, and the image 320-N is input into the blue channel 322-N. Thus, the color image 324 uses or implements a Red Green Blue (RGB) color space in this example. That is, the color image 324 is an RGB color image. Although, the examples discussed herein are described with respect to an RGB color image, it is to be understood that other color spaces (also referred to as color code or color model) can be used in other embodiments. For example, in some embodiments, a Cyan Magenta Yellow Black (CMYK) color space is used. In such embodiments, 4 gray scale images are obtained by the x-ray device 102, with each gray scale image being used as a respective input for a corresponding color channel of the resultant CMYK color image.

Figure 3:
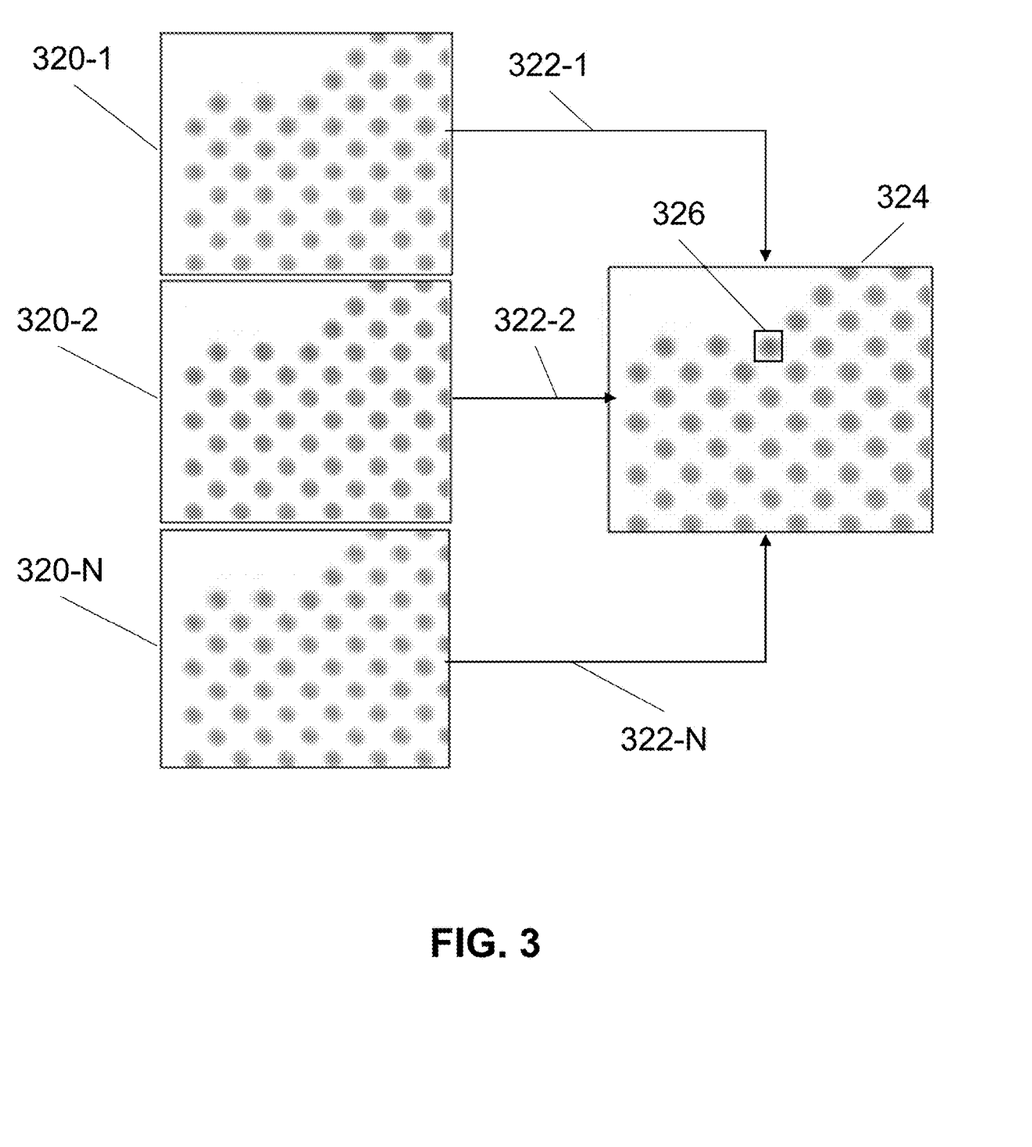
FIG. 3 depicts example x-ray grey scale images combined to form an example color image.

The color image analyzer 108 is configured to identify defects, such as example defect 326, based on analysis of the color image 324. In particular, the color image analyzer 108 implements machine learning techniques to identify defects in the color image 324. The machine learning techniques can include algorithms or models that are generated by performing supervised, unsupervised, or semi-supervised learning on a dataset, and subsequently applying the generated algorithm or model to identify defects, such as the head-in-pillow defect discussed above. However, it is to be understood that the types of defects which can be identified through the techniques discussed herein are not limited to head-in-pillow defects. For example, the color image analyzer 108 can also be configured to analyze the color image 324 in order to identify one or more of first level packaging defects (e.g. C4 flip chip bumps), second level solder joint defects, voiding levels, solder print quality, general interconnect formation defects, underfill defects (such as interface delamination/adhesion defects), among others.

In some embodiments, the color image analyzer 108 is implemented using a convolutional neural network (CNN). Convolutional neural networks are a class of deep feed-forward artificial neural networks that have successfully been applied to analyzing visual imagery. Convolutional neural networks are made up of artificial or neuron-like structures that have learnable weights and biases. Each neuron receives some inputs and performs a dot product. A convolutional neural network architecture typically comprises a stack of layers operating to receive an input (e.g., a single vector) and transforms it through a series of hidden layers. Each hidden layer is made up of a set of neurons, where each neuron has learnable weights and biases, where each neuron can be fully connected to all neurons in the previous layer, and where neurons in a single layer can function independently without any shared connections. The last layer is the fully connected output layer and in classification settings it represents the class scores, which can be arbitrary real-valued numbers, or real-valued targets (e.g. in regression). One example illustrating a possible architecture for convolutional neural networks that may be used in accordance with exemplary embodiments described herein is shown in FIG. 4.

Figure 4:
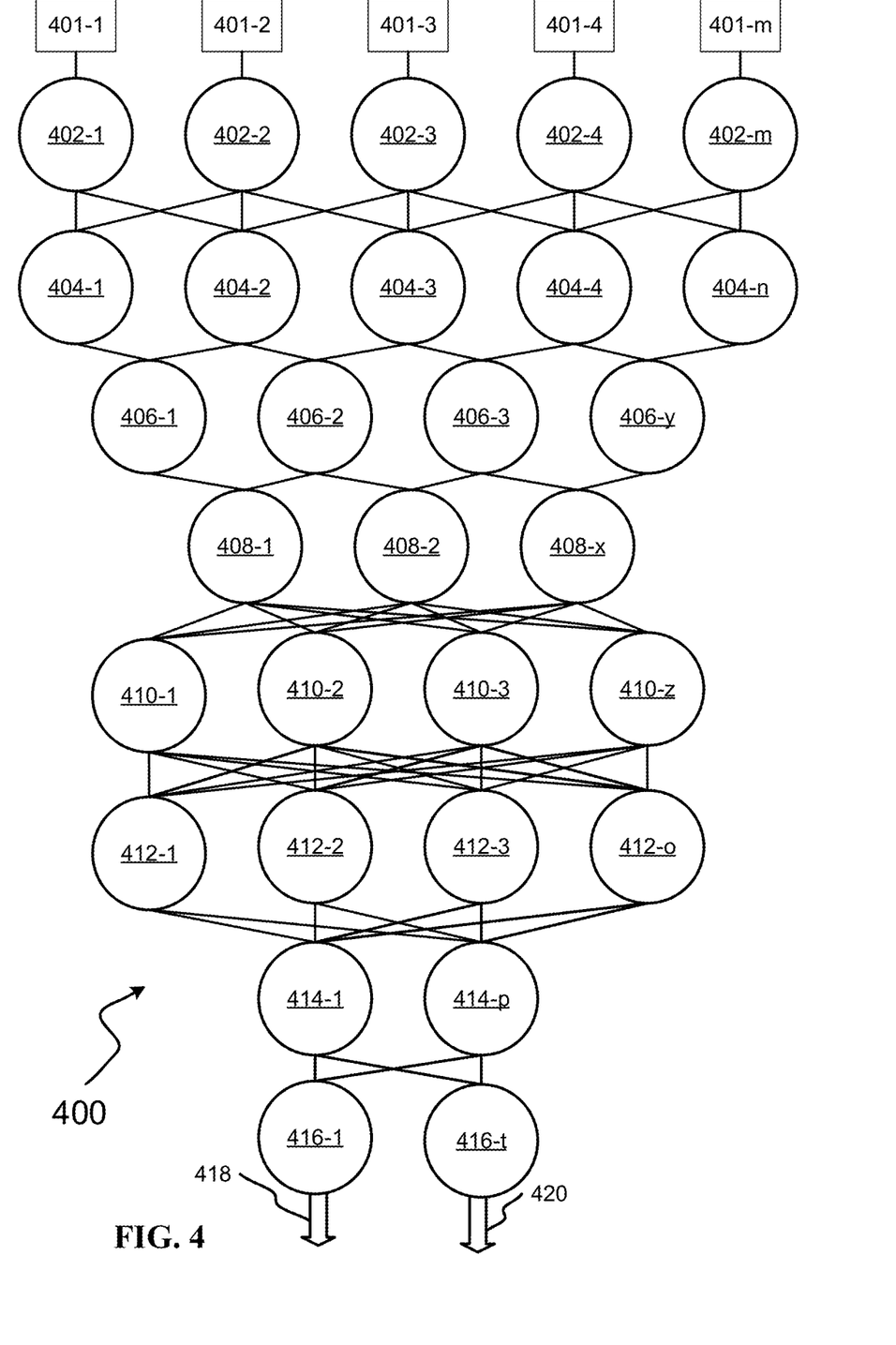
FIG. 4 depicts one embodiment of an example neural network.

FIG. 4 depicts an example neural network 400 that may be used to analyze the generated color images of a printed circuit board assembly to detect defects, as described herein. The example neural network 400 may further be communicably linked to one or more user devices and/or one or more other neural networks. In embodiments, neural network 400 may be a classifier-type neural network. Neural network 400 may be part of a larger neural network (e.g., may be a sub-unit of a larger neural network). For example, neural network 400 may be nested within a single, larger neural network, connected to several other neural networks, or connected to several other neural networks as part of an overall aggregate neural network. It is to be understood that neural network 400 is provided by way of example only and that, in other embodiments, a neural network can be implemented differently. Furthermore, although a convolutional neural network is discussed herein, the embodiments described herein are not limited to convolutional neural networks, but can be implemented using other types of neural networks, such as recurrent neural networks (RNN), Deep Convolutional Inverse Graphics Network (DCIGN), etc., to analyze the generated color image.

Inputs 401-1 through 401-m represent the inputs (e.g. a generated color image) to neural network 400. In this embodiment, inputs 401-1 through 401-m do not represent different inputs. Rather, 401-1 through 401-m represent the same input that is sent to each first-layer neuron (neurons 402-1 through 402-m) in neural network 400. Additionally, it is to be understood that, in some embodiments, each input 401-1 through 401-m represents a subset of the same generated color image, such as determined by an input window sliding along the generated color image. In some embodiments, the number of inputs 401-1 through 401-m (i.e., the number represented by m) may equal (and thus be determined by) the number of first-layer neurons in the network. In other embodiments, neural network 400 may incorporate 1 or more bias neurons in the first layer, in which case the number of inputs 401-1 through 401-m may equal the number of first-layer neurons in the network minus the number of first-layer bias neurons. In some embodiments, a single input (e.g., input 401-1) may be input into the neural network. In such an embodiment, the first layer of the neural network may comprise a single neuron, which may propagate the input to the second layer of neurons.

In this example, neural network 400 comprises 8 layers of neurons (referred to as layers 402, 404, 406, 408, 410, 412, 414, and 416, respectively corresponding to illustrated nodes 402-1 to 402-m, nodes 404-1 to 404-n, nodes 406-1 to 406-y, nodes 408-1 to 408-x, nodes 410-1 to 410-z, 412-1 to 412-o, 414-1 to 414-p, and 416-1 to 416-t). In some embodiments, neural network 400 may have more than 8 layers or fewer than 8 layers. These 8 layers may each be comprised of the same number of neurons as any other layer, more neurons than any other layer, fewer neurons than any other layer, or more neurons than some layers and fewer neurons than other layers. In this embodiment, layer 416 is treated as the output layer. Layer 416 outputs a probability that a target event will occur and contains two neurons (neurons 416-1 and 416-t) in this example. In other embodiments, layer 416 may contain more than 2 neurons or only 1 neuron. In this illustration no bias neurons are shown in neural network 400. However, in some embodiments each layer in neural network 400 may contain one or more bias neurons.

Layers 402-416 may each comprise an activation function. The activation function utilized may be, for example, a rectified linear unit (ReLU) function, a SoftPlus function, a Soft step function, or others. Each layer may use the same activation function, but may also transform the input or output of the layer independently of or dependent upon the activation function. Each layer may be configured for a particular function. For example, in the example of FIG. 4, layer 402 is an input layer. Layer 404 is a convolutional kernel layer configured to process input data. Layer 406 is a pooling layer which is configured to simply input data and remove unnecessary features.

Layer 408 may be a "dropout" layer, which may process the input of the previous layer (here, the inputs) with some neurons removed from processing. This may help to average the data, and can prevent overspecialization of a neural network to one set of data or several sets of similar data. Dropout layers may also help to prepare the data for "dense" layers. Layer 410, for example, may be a dense layer. In this example, the dense layer may process and reduce the dimensions of the feature vector (e.g., the vector portion of inputs 401-1 through 401-m) to eliminate data that is not contributing to the prediction. As a further example, layer 412 may be a "batch normalization" layer. Batch normalization may be used to normalize the outputs of the batch-normalization layer to accelerate learning in the neural network. Layer 414 may be any of a dropout, hidden, or batch-normalization layer. Note that these layers are examples. In other embodiments, any of layers 402 through 414 may be any of dropout, hidden, or batch-normalization layers. This is also true in embodiments with more layers than are illustrated here, or fewer layers.

For example, in some embodiments, the neural network 400 can include a plurality of convolutional kernel layers, each followed by a pooling layer and a dropout layer at the beginning of the CNN. Additionally, at the end of such an embodiment of a CNN there are two or more fully connected layers with one or more dropout layers in the middle. Dropout layers help to prevent overfitting and make the neural network performances more stable in combination with other techniques, such as adjusting momentum and learning rate during the training phase. In some embodiments, the neural network 400 may be trained using stochastic gradient descent on generated training images.

Layer 416 is the output layer. In this embodiment, layer 416 includes two neurons 416-1 and 416-t which produce outputs 418 and 420. Outputs 418 and 420 represent complementary probabilities that a target event will or will not occur. That is, the outputs 418 and 420 represent the probability that a defect exists in the generated image. For example, output 418 may represent the probability that a defect exists, and output 420 may represent the probability that a defect does not exist. In some embodiments, outputs 418 and 420 may each be between 0.0 and 1.0, and may add up to 1.0. In such embodiments, a probability of 1.0 may represent a projected absolute certainty (e.g., if output 418 were 1.0, the projected chance that a defect exists would be 100%, whereas if output 420 were 1.0, the projected chance that a defect does not exist would be 100%). It is to be understood that, although two output neurons 416-1 and 416-t are depicted in this example, layer 416 can include other numbers of output neurons in other embodiments. For example, in some embodiments, a single output neuron 416 is used to output one of outputs 418 or 420. In addition, in some embodiments, the outputs of output layer 416 are used by the color image analyzer 108 to annotate the input generated color image 324 with an indication of a detected defect 326.

By generating a color image from the gray scale image slices captured by an x-ray device 102, the color image contains color variations which can be detected by the color image analyzer 108 using a neural network, such as a CNN. The CNN can be trained to correlate the detected color variations with defects in the PCBA. Thus, this novel technique for analyzing a PCBA provides a relatively quick pass/fail determination for a PCBA without requiring a separate offline inspection. For example, the embodiments described herein are capable of analyzing images of a PCBA to make a determination measured in terms of seconds as opposed to one or more hours for conventional techniques involving separate offline inspections. Furthermore, the techniques described herein can attain a sufficient accuracy or catch percentage rate for use in the manufacturing process. Thus, the techniques and system described herein are capable of being deployed in the manufacturing process to improve the speed of detection and accuracy of detection.

Figure 5:
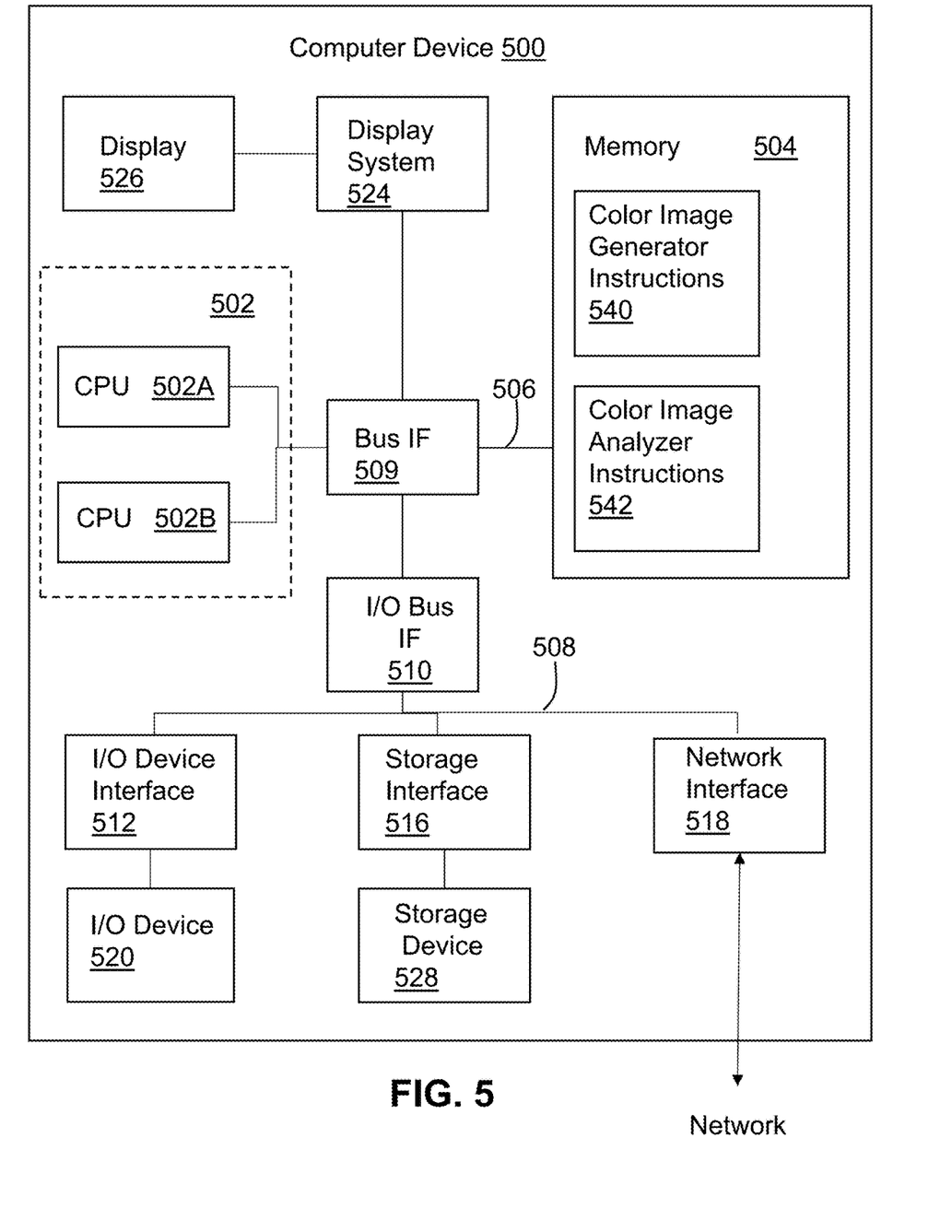
FIG. 5 is a block diagram depicting one embodiment of an example computer device.

FIG. 5 is a block diagram depicting one embodiment of an example computer device 500. The computer device 500 can be used to implement the defect detection device 104 and/or the x-ray device 102. The components of the computer device 500 shown in FIG. 5 include one or more processors 502, a memory 504, a storage interface 516, an Input/Output ("I/O") device interface 512, and a network interface 518, all of which are communicatively coupled, directly or indirectly, for inter-component communication via a memory bus 506, an I/O bus 508, bus interface unit ("IF") 509, and an I/O bus interface unit 510.

In the embodiment shown in FIG. 5, the computer device 500 includes one or more general-purpose programmable central processing units (CPUs) 502A and 502B, herein generically referred to as the processor 502. In some embodiments, the computer device 500 contains multiple processors. However, in other embodiments, the computer device 500 is a single CPU system. Each processor 502 executes instructions stored in the memory 504. Additionally, although the embodiments are described with respect to central processing unit chips, it is to be understood that the embodiments described herein are also applicable to a computer system utilizing digital signal processors (DSP) and/or graphic processing unit (GPU) chips in addition to or in lieu of CPU chips. Furthermore, in some embodiments, the processor 502 can be implemented using neural processing unit (NPU) chips, such as the IBM TrueNorth chip. However, use of neural processing units to implement a neural network is not required. Hence, reference to a processor or processing unit herein can refer to CPU chips, GPU chips, DSP, and/or NPU chips.

In some embodiments, the memory 504 includes a random-access semiconductor memory, storage device, or storage medium (either volatile or non-volatile) for storing or encoding data and programs. For example, the memory 504 stores color image generator instructions 540 and color image analyzer instructions 542. When executed by a processor such as processor 502, the color image generator instructions 540 cause the processor 502 to perform the functions and calculations discussed above with respect to producing a color image by inputting gray scale x-ray image slices into a respective color channel of the resultant color image. Additionally, when executed by a processor such as processor 502, the color image analyzer instructions 542 cause the processor 502 to perform the image analysis on the generated color image, as described above. Thus, the color image analyzer instructions 542 can cause the computer device 500 to implement at least a portion of a convolutional neural network configured to analyze the color images.

Additionally, the color image analyzer instructions 542 can be configured to cause the processor 502 to output commands to the display system 524 to display a result of the analysis, such as an annotated color image or other audio or visual output, to indicate identified defects in a printed circuit board assembly on the display device 526, as described above.

In some embodiments, the memory 504 represents the entire virtual memory of the computer device 500 and may also include the virtual memory of other computer devices coupled to the computer device 500 via a network. In some embodiments, the memory 504 is a single monolithic entity, but in other embodiments, the memory 504 includes a hierarchy of caches and other memory devices. For example, the memory 504 can exist in multiple levels of caches, and these caches may be further divided by function, so that one cache holds instructions while another holds non-instruction data, which is used by the processor. The memory 504 may be further distributed and associated with different processing units or sets of processing units, as is known in any various so-called non-uniform memory access (NUMA) computer architectures, for example. Hence, although the color image generator instructions 540 and the color image analyzer instructions 542 are stored on the same memory 504 in the example shown in FIG. 5 for purposes of explanation, it is to be understood that other embodiments can be implemented differently. For example, the color image generator instructions 540 and or the color image analyzer instructions 542 can be distributed across multiple physical media.

The computer device 500 in the embodiment shown in FIG. 5 also includes a bus interface unit 509 to handle communications among the processor 502, the memory 504, the display system 524, and the I/O bus interface unit 510. The I/O bus interface unit 510 is coupled with the I/O bus 508 for transferring data to and from the various I/O units. In particular, the I/O bus interface unit 510 can communicate with multiple I/O interface units 512, 516, and 518, which are also known as I/O processors (IOPs) or I/O adapters (IOAs), through the I/O bus 508. The display system 524 includes a display controller, a display memory, or both. The display controller can provide video, still images, audio, or a combination thereof to a display device 526. The display memory may be a dedicated memory for buffering video data. The display system 524 is coupled with the display device 526. In some embodiments, the display device 526 also includes one or more speakers for rendering audio. Alternatively, one or more speakers for rendering audio may be coupled with an I/O interface unit. In alternate embodiments, one or more functions provided by the display system 524 are on board an integrated circuit that also includes the processor 502. In addition, in some embodiments, one or more of the functions provided by the bus interface unit 509 is on board an integrated circuit that also includes the processor 502.

The I/O interface units support communication with a variety of storage and I/O devices. For example, the I/O device interface unit 512 supports the attachment of one or more user I/O devices 520, which may include user output devices and user input devices (such as a keyboard, mouse, keypad, touchpad, trackball, buttons, light pen, or other pointing devices). A user can manipulate the user input devices 520 using a user interface, in order to provide input data and commands to the user I/O device 520. Additionally, a user can receive output data via the user output devices. For example, a user interface may be presented via the user I/O device 520, such as displayed on a display device or played via a speaker.

The storage interface 516 supports the attachment of one or more storage devices 528, such as a flash memory. The contents of the memory 504, or any portion thereof, may be stored to and retrieved from the storage device 528 as needed. The network interface 518 provides one or more communication paths from the computer device 500 to other digital devices and computer device. For example, in some embodiments the generated color image can be transmitted over the network interface 518 to a separate system configured to perform the color image analysis. Additionally, in some embodiments, the network interface 518 can be configured to receive 2-dimensional gray scale images from an x-ray device. Alternatively, the 2-dimensional gray scale images, the generated color image and/or the alerts or results of analysis can be communicated via a different interface, such as the I/O device interface 512, rather than the network interface 518.

Although the computer device 500 shown in FIG. 5 illustrates a particular bus structure providing a direct communication path among the processors 502, the memory 504, the bus interface unit 509, the display system 524, and the I/O bus interface unit 510, in alternative embodiments the computer device 500 includes different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 510 and the I/O bus 508 are shown as single respective units, the computer device 500, can include multiple I/O bus interface units 510 and/or multiple I/O buses 508 in other embodiments. While multiple I/O interface units are shown, which separate the I/O bus 508 from various communication paths running to the various I/O devices, in other embodiments, some or all of the I/O devices are connected directly to one or more system I/O buses.

As discussed above, in some embodiments, one or more of the components and data shown in FIG. 5 include instructions or statements that execute on the processor 502 or instructions or statements that are interpreted by instructions or statements that execute on the processor 502 to carry out the functions as described herein. In other embodiments, one or more of the components shown in FIG. 5 are implemented in hardware via semiconductor devices, chips, logical gates, circuits, circuit cards, and/or other physical hardware devices in lieu of, or in addition to, a processor-based system. In addition, in other embodiments, some of the components shown in FIG. 5 can be omitted and/or other components can be included.

Figure 6:
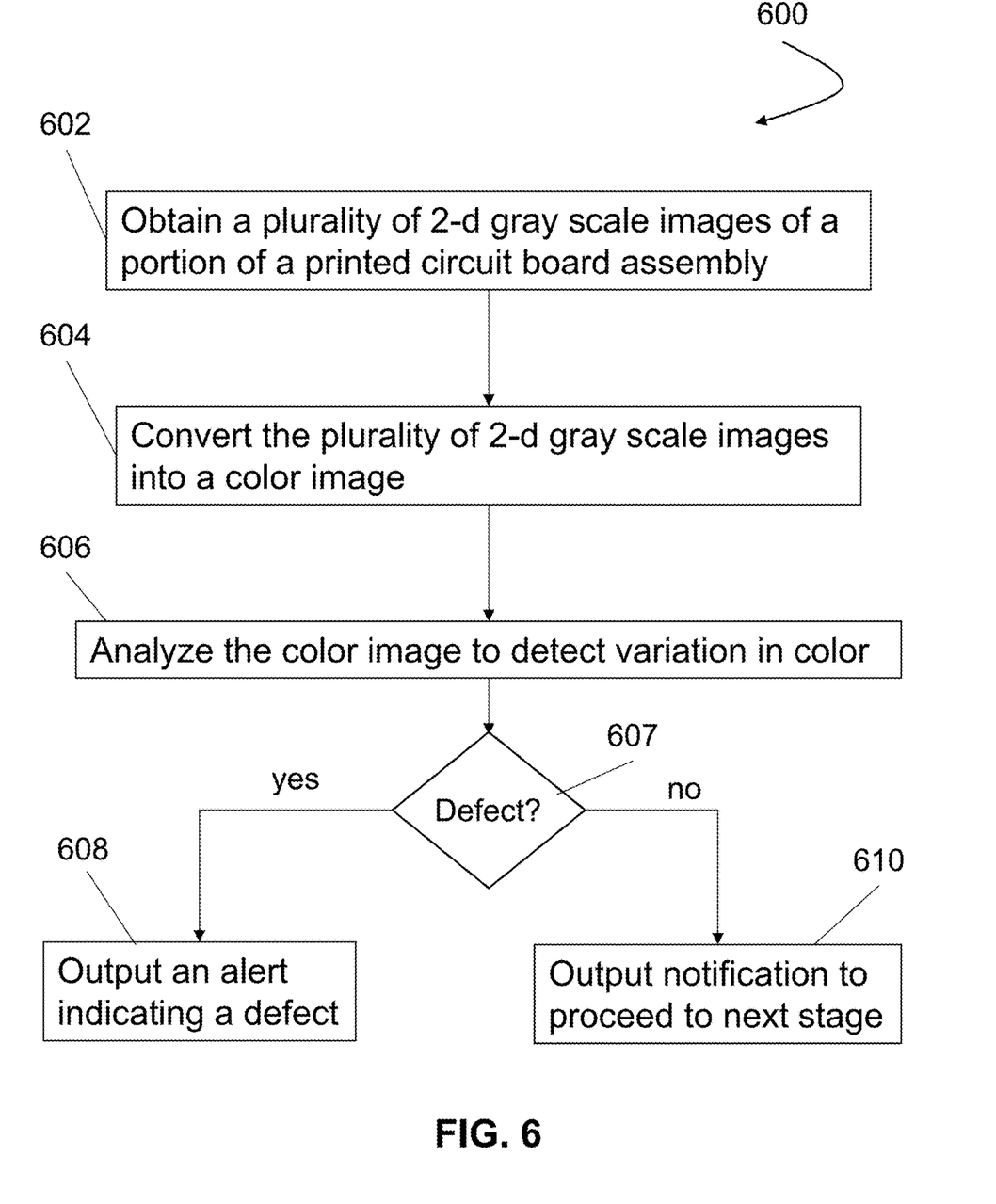
FIG. 6 is a flow chart depicting one embodiment of an example method of detecting defects in a printed circuit board assembly.

FIG. 6 is a flow chart depicting one embodiment of an example method 600 of detecting defects in a printed circuit board assembly. The method 600 can be implemented by an x-ray device, such as x-ray device 102, and/or a defect detection device, such as defect detection device 104. Thus, one or more of the actions described with respect to method 600 can be performed by one of the x-ray device or the defect detection device. In some embodiments, a portion of the method 600 is performed by an x-ray device and a portion of the method 600 is performed by a separate defect detection device. In other embodiments, all of the actions of method 600 are performed by a single device. The method 600 can be implemented by a processor, such as processor 502 in computer device 500, executing instructions, such as color image generation instructions 540 and/or color image analyzer instructions 542.

At 602, a plurality of 2-dimensional gray scale images of a portion of a printed circuit board assembly are obtained. Each 2-dimensional gray scale image corresponds to one of a plurality of parallel planes intersecting the portion of the printed circuit board assembly at respective different locations, as discussed above. In some embodiments, obtaining the plurality of 2-dimensional gray scale images comprises receiving the plurality of 2-dimensional gray scale images from an x-ray device configured to capture x-ray images of the printed circuit board assembly. In other embodiments, obtaining the plurality of 2-dimensional gray scale images includes capturing the 2-dimensional gray scale images with an x-ray device. Suitable x-ray devices for capturing 2-dimensional image slices of a printed circuit board assembly are known to one of skill in the art.

At 604, the plurality of 2-dimensional gray scale images are converted into a color image. In particular, each of the 2-dimensional gray scale images are applied or input to a respective color channel of the color image. For example, in some embodiments, the color image is a Red Green Blue (RGB) color image. Thus, in such embodiments, the plurality of 2-dimensional gray scale images comprises three 2-dimensional gray scale images where each of the three 2-dimensional gray scale images corresponds to a respective one of a red channel, a blue channel, or a green channel of the RGB color image.

However, as discussed above, the embodiments described herein are not limited to using images in the RGB color space. For example, in other embodiments, the color image is a Cyan Yellow Magenta Black (CMYK) color image. Thus, in such embodiments, the plurality of 2-dimensional gray scale images comprises four 2-dimensional gray scale images where each of the four 2-dimensional gray scale images corresponding to a respective one of a cyan channel, a yellow channel, a magenta channel, and a black channel of the CMYK color image. As discussed above, in some embodiments, the x-ray device is further configured to generate the color image. In other embodiments, the x-ray device provides the plurality of 2-dimensional gray scale images to a separate device that generates the color image from the 2-dimensional gray scale images.

At 606, the color image is analyzed to detect variation in color that indicates a defect. For example, in some embodiments, the color variation can indicate a defect in a solder ball connection of a ball grid array. However, the embodiments described herein are not limited to defects in a solder ball connection of a ball grid array. For example, the color image can be analyzed to identify defects in connections of a smaller chip scale package. Additionally, the defects which can be identified by detecting color variations in the color image can include one or more of head-in-pillow defects, first level packaging defects, second level solder joint defects, voiding defects, solder print quality, and underfill defects, etc. Furthermore, as discussed above, the analysis can be performed by a neural network, such as a convolutional neural network configured to detect variations in color that indicate a defect. At 607, it is determined if a defect has been identified based on the analysis of the color image.

At 608, an alert indicating the identified defect is output in response to identifying a defect based on detecting the variation in color. In some embodiments, the alert can include an annotated color image indicating a location of the defect corresponding to a location of the identified color variation. In other embodiments, the alert can be audible alert or other displayed alert. Furthermore, in some embodiments, the alert can include a recommendation for 3-dimensional x-ray analysis. However, such a recommendation for 3-dimensional x-ray analysis is not required. In addition, in some embodiments, the alert is provided upon detection of a single defect even if analysis of the entire color image is not complete. In other embodiments, the alert is output after analysis of the entire image is complete. Thus, in some such embodiments, the alert can include a report of the total number of defects identified/detected.

If a defect is not identified at 607, then a notification is output at 610 indicating that no defect was identified. For example, in some embodiments, the notification indicates that the printed circuit board assembly can proceed to a next stage of the manufacturing process.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition, as discussed above, the functionality of the defect detection device can be implemented remote from the x-ray device, such as in a cloud computing environment. In some such embodiments, the system can learn and refine models using images gathered from multiple different PCBA manufacturers. However, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
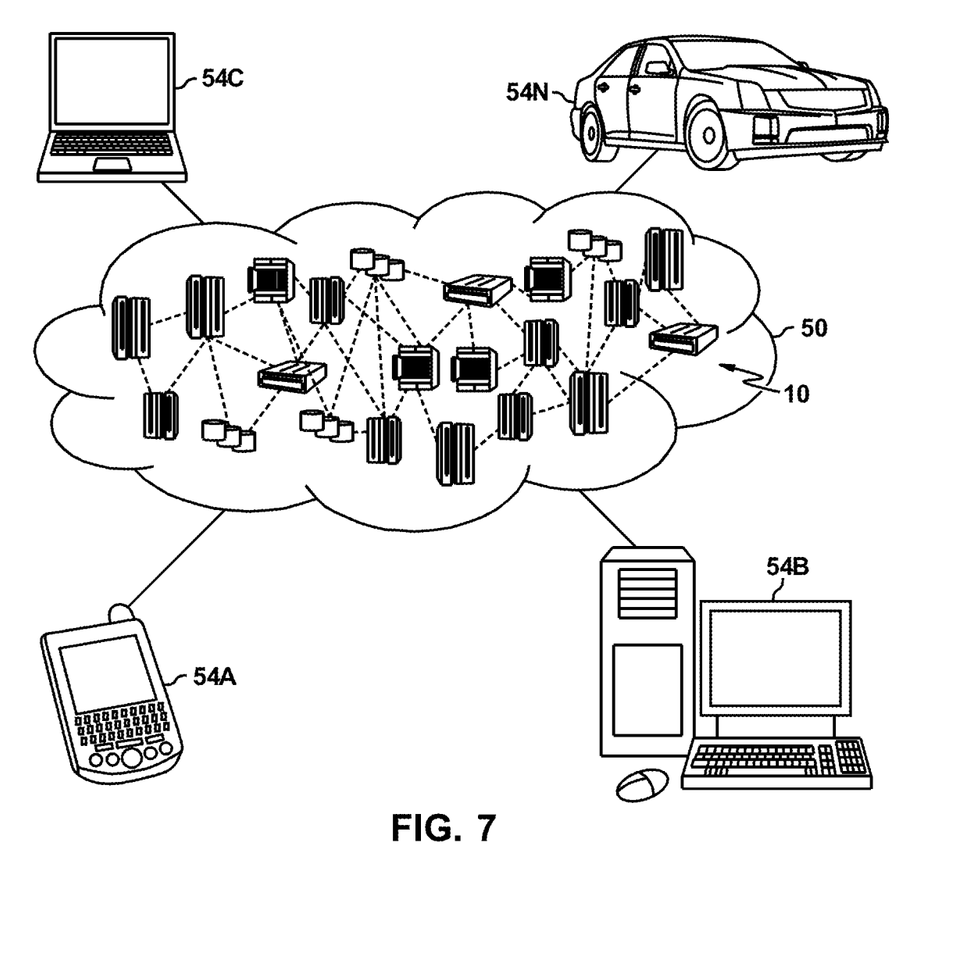
FIG. 7 depicts one embodiment of a cloud computing environment.

Referring now to FIG. 7, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer device 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
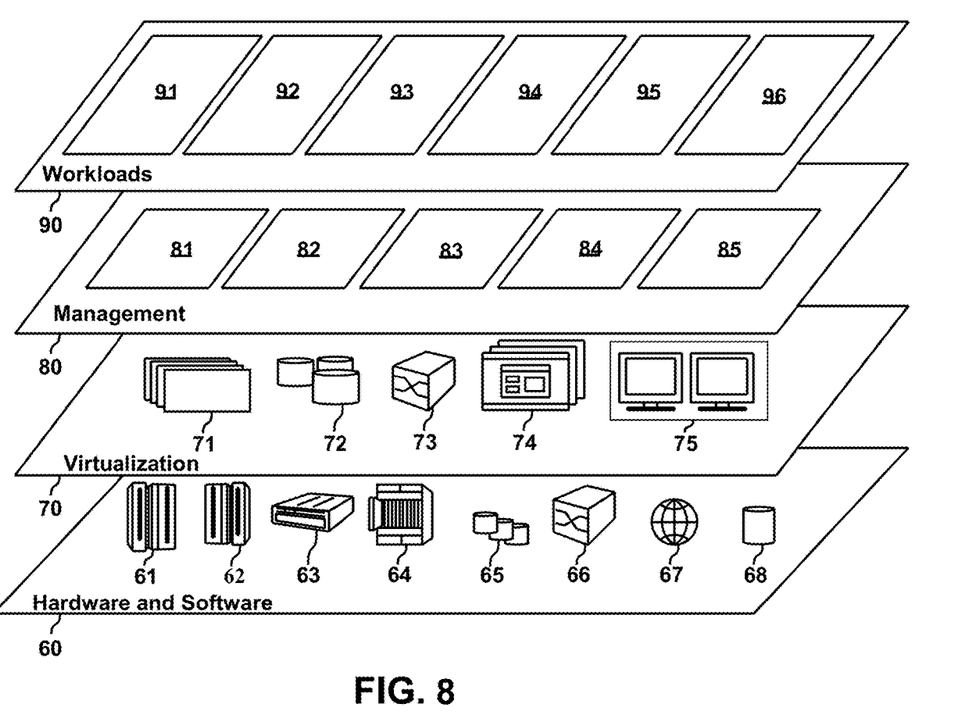
FIG. 8 depicts one embodiment of abstraction model layers.

Referring now to FIG. 8, a set of functional abstraction layers provided by cloud computing environment 50 (FIG. 5) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and PCBA defect detection 96 using color images generated from 2-d gray scale x-ray images.

EXAMPLE EMBODIMENTS

Example 1 includes a method. The method comprises obtaining a plurality of 2-dimensional gray scale images of a portion of a printed circuit board assembly. Each 2-dimensional gray scale image corresponds to one of a plurality of parallel planes intersecting the portion of the printed circuit board assembly at respective different locations. The method further comprises converting the plurality of 2-dimensional gray scale images into a color image. Each of the plurality of 2-dimensional gray scale images corresponds to and is used as input for a respective color channel of the color image. The method further comprises analyzing the color image to detect variation in color that indicates a defect; and outputting an alert indicating the defect in response to detecting the variation in color.

Example 2 includes the method of example 1, wherein the color image is a Red Green Blue (RGB) color image; and wherein the plurality of 2-dimensional gray scale images comprises three 2-dimensional gray scale images, each of the three 2-dimensional gray scale images corresponding to a respective one of a red channel, a blue channel, or a green channel of the RGB color image.

Example 3 includes the method of any of examples 1-2, wherein analyzing the color image to detect variation in color that indicates a defect comprises analyzing the color image to detect a defect in a solder ball connection of a ball grid array.

Example 4 includes the method of any of examples 1 or 3, wherein the color image is a Cyan Yellow Magenta Black (CMYK) color image; and wherein the plurality of 2-dimensional gray scale images comprises four 2-dimensional gray scale images, each of the four 2-dimensional gray scale images corresponding to a respective one of a cyan channel, a yellow channel, a magenta channel, and a black channel of the CMYK color image.

Example 5 includes the method of any of examples 1-4, wherein obtaining the plurality of 2-dimensional gray scale images comprises receiving the plurality of 2-dimensional gray scale images from a device configured to capture x-ray images of the printed circuit board assembly.

Example 6 includes the method of any of examples 1-4, wherein obtaining the plurality of 2-dimensional gray scale images comprises capturing the plurality of 2-dimensional gray scale images with an x-ray device configured to capture x-ray images of the printed circuit board; and wherein converting the plurality of 2-dimensional gray scale images into the color image comprises converting the plurality of 2-dimensional images into the color image with the x-ray device configured to capture the plurality of 2-dimensional gray scale images.

Example 7 includes the method of any of examples 1-6, wherein analyzing the color image comprises processing the color image in a convolutional neural network to detect the variation in color that indicates a defect.

Example 8 includes a device comprising an interface communicatively coupled to an x-ray device configured to capture 2-dimensional gray scale images of a printed circuit board; and a processor communicatively coupled to the interface. The processor is configured to analyze a color image generated from a plurality of 2-dimensional gray scale images captured by the x-ray device to identify color variation that indicates a defect in the printed circuit board assembly. The color image is generated by inputting each of the plurality of 2-dimensional gray scale images into a respective color channel of the color image. The processor is further configured to output an alert indicating the defect in response to identifying the color variation.

Example 9 includes the device of example 8, wherein the processor is further configured to generate the color image from the plurality of 2-dimensional gray scale images.

Example 10 includes the device of example 8, wherein the interface is configured to receive the color image from the x-ray device.

Example 11 includes the device of any of examples 8-10, wherein the processor is further configured to analyze the color image to detect variation in color that indicates a defect in a solder ball connection of a ball grid array.

Example 12 includes the device of any of examples 8-11, wherein the color image is a Red Green Blue (RGB) color image; and wherein the plurality of 2-dimensional gray scale images comprises three 2-dimensional gray scale images, each of the three 2-dimensional gray scale images corresponding to a respective one of a red channel, a blue channel, or a green channel of the RGB color image.

Example 13 includes the device of any of examples 8-12, wherein the processor is configured to implement a convolutional neural network configured to analyze the color image to identify the color variation that indicates a defect.

Example 14 includes a system comprising an x-ray device configured to capture a plurality of 2-dimensional gray scale images of a printed circuit board assembly. Each 2-dimensional gray scale image corresponds to one of a plurality of parallel planes intersecting the portion of the printed circuit board assembly at respective different locations. The system further includes a defect detection device comprising a processor configured to analyze a color image generated from the plurality of 2-dimensional gray scale images captured by the x-ray device to identify color variation that indicates a defect in the printed circuit board assembly, each of the plurality of 2-dimensional gray scale images corresponding to a respective color channel of the color image; and output an alert indicating the defect in response to identifying the color variation.

Example 15 includes the system of example 14, wherein the x-ray device further comprises a processor configured to generate the color image by inputting each of the plurality of 2-dimensional gray scale images into the corresponding respective color channel of the color image.

Example 16 includes the system of any of examples 14-15, wherein the color image is a Red Green Blue (RGB) color image; and wherein the plurality of 2-dimensional gray scale images comprises three 2-dimensional gray scale images, each of the three 2-dimensional gray scale images corresponding to a respective one of a red channel, a blue channel, or a green channel of the RGB color image.

Example 17 includes the system of any of examples 14-16, wherein the processor in the defect detection device is further configured to analyze the color image to detect variation in color that indicates a defect in a solder ball connection of a ball grid array.

Example 18 includes the system of any of examples 14-17, wherein the processor in the defect detection device is configured to implement a convolutional neural network configured to analyze the color image to identify the color variation that indicates a defect.

Example 19 includes the system of any of examples 14-18, wherein the x-ray device and the defect detection device share a common housing.

Example 20 includes a computer program product comprising a computer readable storage medium having a computer readable program stored therein, wherein the computer readable program, when executed by a processor, causes the processor to generate a color image from a plurality of 2-dimensional gray scale images by inputting each of the plurality of 2-dimensional gray scale images into a corresponding color channel of the color image, wherein each 2-dimensional gray scale image corresponds to one of a plurality of parallel planes intersecting a portion of a printed circuit board assembly at respective different locations; analyze the color image to detect variation in color that indicates a defect in the printed circuit board assembly; and output an alert indicating the defect in response to detecting the variation in color.

Example 21 includes the computer program product of example 20, wherein the computer readable program is further configured to cause the processor to detect variation in color that indicates a defect in a solder ball connection of a ball grid array.

Example 22 includes the computer program product of any of examples 20-21, wherein the computer readable program implements a convolutional neural network configured to analyze the color image to identify the color variation that indicates a defect.

Example 23 includes the computer program product of any of examples 20-22, wherein the color image is a Red Green Blue (RGB) color image; and wherein the plurality of 2-dimensional gray scale images comprises three 2-dimensional gray scale images, each of the three 2-dimensional gray scale images corresponding to a respective one of a red channel, a blue channel, or a green channel of the RGB color image.

Example 24 includes the computer product of any of examples 20-23, wherein the computer readable program is further configured to cause the processor to output an alert comprising an annotated color image indicating a location of the defect.

Example 25 includes the computer program product of any of examples 20-24, wherein the variation in color indicates one of a head-in-pillow defect, first level packaging defects, second level solder joint defects, voiding defects, solder print quality, and underfill defects.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method comprising:
   obtaining a plurality of 2-dimensional gray scale images of a portion of a printed circuit board assembly, each 2-dimensional gray scale image corresponding to one of a plurality of parallel planes intersecting the portion of the printed circuit board assembly at respective different locations;
   converting the plurality of 2-dimensional gray scale images into a color image, each of the plurality of 2-dimensional gray scale images corresponding to and used as input for a respective color channel of the color image;
   analyzing the color image to detect variation in color that indicates a defect; and
   outputting an alert indicating the defect in response to detecting the variation in color.

2. The method of claim 1, wherein the color image is a Red Green Blue (RGB) color image; and
   wherein the plurality of 2-dimensional gray scale images comprises three 2-dimensional gray scale images, each of the three 2-dimensional gray scale images corresponding to a respective one of a red channel, a blue channel, or a green channel of the RGB color image.

3. The method of claim 1, wherein analyzing the color image to detect variation in color that indicates a defect comprises analyzing the color image to detect a defect in a solder ball connection of a ball grid array.

4. The method of claim 1, wherein the color image is a Cyan Yellow Magenta Black (CMYK) color image; and
   wherein the plurality of 2-dimensional gray scale images comprises four 2-dimensional gray scale images, each of the four 2-dimensional gray scale images corresponding to a respective one of a cyan channel, a yellow channel, a magenta channel, and a black channel of the CMYK color image.

5. The method of claim 1, wherein obtaining the plurality of 2-dimensional gray scale images comprises receiving the plurality of 2-dimensional gray scale images from a device configured to capture x-ray images of the printed circuit board assembly.

6. The method of claim 1, wherein obtaining the plurality of 2-dimensional gray scale images comprises capturing the plurality of 2-dimensional gray scale images with an x-ray device configured to capture x-ray images of the printed circuit board; and
   wherein converting the plurality of 2-dimensional gray scale images into the color image comprises converting the plurality of 2-dimensional images into the color image with the x-ray device configured to capture the plurality of 2-dimensional gray scale images.

7. The method of claim 1, wherein analyzing the color image comprises processing the color image in a convolutional neural network to detect the variation in color that indicates a defect.

8. A device comprising:
   an interface communicatively coupled to an x-ray device configured to capture 2-dimensional gray scale images of a printed circuit board; and a processor communicatively coupled to the interface and configured to:
   analyze a color image generated from a plurality of 2-dimensional gray scale images captured by the x-ray device to identify color variation that indicates a defect in the printed circuit board assembly, the color image generated by inputting each of the plurality of 2-dimensional gray scale images into a respective color channel of the color image; and
   output an alert indicating the defect in response to identifying the color variation.

9. The device of claim 8, wherein the processor is further configured to generate the color image from the plurality of 2-dimensional gray scale images.

10. The device of claim 8, wherein the interface is configured to receive the color image from the x-ray device.

11. The device of claim 8, wherein the processor is further configured to analyze the color image to detect variation in color that indicates a defect in a solder ball connection of a ball grid array.

12. The device of claim 8, wherein the color image is a Red Green Blue (RGB) color image; and
   wherein the plurality of 2-dimensional gray scale images comprises three 2-dimensional gray scale images, each of the three 2-dimensional gray scale images corresponding to a respective one of a red channel, a blue channel, or a green channel of the RGB color image.

13. The device of claim 8, wherein the processor is configured to implement a convolutional neural network configured to analyze the color image to identify the color variation that indicates a defect.

14. A system comprising:
   an x-ray device configured to capture a plurality of 2-dimensional gray scale images of a printed circuit board assembly, each 2-dimensional gray scale image corresponding to one of a plurality of parallel planes intersecting the portion of the printed circuit board assembly at respective different locations; and
   a defect detection device comprising a processor configured to:
      analyze a color image generated from the plurality of 2-dimensional gray scale images captured by the x-ray device to identify color variation that indicates a defect in the printed circuit board assembly, each of the plurality of 2-dimensional gray scale images corresponding to a respective color channel of the color image; and
      output an alert indicating the defect in response to identifying the color variation.

15. The system of claim 14, wherein the x-ray device further comprises a processor configured to generate the color image by inputting each of the plurality of 2-dimensional gray scale images into the corresponding respective color channel of the color image.

16. The system of claim 14, wherein the color image is a Red Green Blue (RGB) color image; and
   wherein the plurality of 2-dimensional gray scale images comprises three 2-dimensional gray scale images, each of the three 2-dimensional gray scale images corresponding to a respective one of a red channel, a blue channel, or a green channel of the RGB color image.

17. The system of claim 14, wherein the processor in the defect detection device is further configured to analyze the color image to detect variation in color that indicates a defect in a solder ball connection of a ball grid array.

18. The system of claim 14, wherein the processor in the defect detection device is configured to implement a convolutional neural network configured to analyze the color image to identify the color variation that indicates a defect.

19. The system of claim 14, wherein the x-ray device and the defect detection device share a common housing.

20. A computer program product comprising a computer readable storage medium having a computer readable program stored therein, wherein the computer readable program, when executed by a processor, causes the processor to:
   generate a color image from a plurality of 2-dimensional gray scale images by inputting each of the plurality of 2-dimensional gray scale images into a corresponding color channel of the color image, wherein each 2-dimensional gray scale image corresponds to one of a plurality of parallel planes intersecting a portion of a printed circuit board assembly at respective different locations;
   analyze the color image to detect variation in color that indicates a defect in the printed circuit board assembly; and
   output an alert indicating the defect in response to detecting the variation in color.

21. The computer program product of claim 20, wherein the computer readable program is further configured to cause the processor to detect variation in color that indicates a defect in a solder ball connection of a ball grid array.

22. The computer program product of claim 20, wherein the computer readable program implements a convolutional neural network configured to analyze the color image to identify the color variation that indicates a defect.

23. The computer program product of claim 20, wherein the color image is a Red Green Blue (RGB) color image; and
   wherein the plurality of 2-dimensional gray scale images comprises three 2-dimensional gray scale images, each of the three 2-dimensional gray scale images corresponding to a respective one of a red channel, a blue channel, or a green channel of the RGB color image.

24. The computer product of claim 20, wherein the computer readable program is further configured to cause the processor to output an alert comprising an annotated color image indicating a location of the defect.

25. The computer program product of claim 20, wherein the variation in color indicates one of a head-in-pillow defect, first level packaging defects, second level solder joint defects, voiding defects, solder print quality, and underfill defects.

* * * * *